United States Patent [19]
Dreifus et al.

[11] Patent Number: 5,576,589
[45] Date of Patent: Nov. 19, 1996

[54] DIAMOND SURFACE ACOUSTIC WAVE DEVICES

[75] Inventors: David L. Dreifus; Michelle L. Hartsell, both of Cary, N.C.

[73] Assignee: Kobe Steel USA, Inc., Durham, N.C.

[21] Appl. No.: 322,710

[22] Filed: Oct. 13, 1994

[51] Int. Cl.⁶ .......................... H03H 9/145; H01L 41/18
[52] U.S. Cl. ..................... 310/313 A; 310/313 R
[58] Field of Search .................. 310/313 A, 313 B, 310/313 R; 364/821; 333/193, 194

[56] References Cited

U.S. PATENT DOCUMENTS

| | | | |
|---|---|---|---|
| 3,872,410 | 3/1975 | Zucker | 310/313 R |
| 4,281,407 | 7/1981 | Tosima | 310/313 R |
| 4,396,851 | 8/1983 | Kishimoto et al. | 310/313 B |
| 4,453,242 | 6/1984 | Toda | 310/313 R |
| 4,477,892 | 10/1984 | Tosima et al. | 310/313 R |
| 4,511,816 | 4/1985 | Mikoshiba et al. | 310/313 A |
| 4,516,049 | 5/1985 | Mikoshiba et al. | 310/313 A |
| 4,516,095 | 5/1985 | Lee | 310/313 R |
| 4,567,393 | 1/1986 | Asai et al. | 310/313 A |
| 4,571,519 | 2/1986 | Kawabata et al. | 310/313 A |
| 4,820,897 | 4/1989 | Lefevre | 310/311 |
| 4,868,444 | 9/1989 | Shibata et al. | 310/313 A |
| 4,952,832 | 8/1990 | Imai et al. | 310/313 A |
| 5,059,847 | 10/1991 | Tanaka et al. | 310/313 A |
| 5,061,870 | 10/1991 | Ieki et al. | 310/313 A |
| 5,066,938 | 11/1991 | Kobashi et al. | 338/225 D |
| 5,160,869 | 11/1992 | Nakahata et al. | 310/313 A |
| 5,221,870 | 6/1993 | Nakahata et al. | 310/313 A |
| 5,235,233 | 8/1993 | Yamamoto | 310/313 A |
| 5,235,236 | 8/1993 | Nakahata et al. | 310/313 R |
| 5,236,545 | 8/1993 | Pryor | 156/613 |
| 5,294,858 | 3/1994 | Nakahata et al. | 310/313 A |
| 5,320,865 | 6/1994 | Nakahata et al. | 310/313 R |
| 5,329,208 | 7/1994 | Imai et al. | 310/313 R |
| 5,343,107 | 8/1994 | Shikata et al. | 310/313 A |
| 5,345,201 | 9/1994 | Greer et al. | 310/313 R |
| 5,402,029 | 3/1995 | Nakamura et al. | 310/313 R |
| 5,420,443 | 5/1995 | Dreifus et al. | 257/77 |
| 5,440,188 | 8/1995 | Krempl et al. | 310/313 A |

FOREIGN PATENT DOCUMENTS

| | | |
|---|---|---|
| 0534165A1 | 3/1993 | European Pat. Off. . |
| 0587068A1 | 3/1994 | European Pat. Off. . |
| 4302171 | 7/1994 | Germany ............... 333/193 |
| 60-090417 | 5/1985 | Japan . |
| 0117509 | 5/1988 | Japan ............... 310/313 A |
| 0184411 | 7/1988 | Japan ............... 310/313 A |
| 63-301609 | 12/1988 | Japan . |
| 5083068 | 4/1993 | Japan . |
| 5122002 | 5/1993 | Japan ............... 333/193 |
| 1039017 | 8/1983 | U.S.S.R. ............... 333/193 |
| 1440950 | 6/1976 | United Kingdom ............. 310/313 A |
| 2256104 | 11/1992 | United Kingdom . |

OTHER PUBLICATIONS

"The Method of Fine Frequency Adjustment for Acoustic Surface Wave Filters" J. Minowa, Transactions IECE of Japan, vol. E 60, No. 10, Abstracts, Oct. 10, 1977.
PCT International Search Report mailed Mar. 27, 1996.
S. Shikata et al., *1.5GHz Saw Bandpass Filter Using Poly–Crystalline Diamond*, IEEE 1993 Ultrasonics Symposium, Proceedings, vol. 1, 93CH3301–9, ISSN: 1051–0117, Oct. 31–Nov. 3, 1993, pp. 277–280.

(List continued on next page.)

Primary Examiner—Thomas M. Dougherty
Attorney, Agent, or Firm—Bell, Seltzer, Park & Gibson

[57] ABSTRACT

A high frequency Surface Acoustic Wave (SAW) device includes a highly oriented diamond layer adjacent a piezoelectric layer. In one embodiment, laterally spaced apart piezoelectric layers or portions confine propagation of the wave within the diamond layer. Interdigitated electrodes may be provided by electrically conductive metal lines and/or by heavily doped surface portions of the diamond layer. Undesirable reflections may be reduced by providing the piezoelectric layer with opposing ends canted at an angle from orthogonal to the axis of surface acoustic wave propagation. The surface acoustic wave device may be used as a filter, amplifier, convolver, and phase shifter. Methods for making the surface acoustic wave device are also disclosed.

45 Claims, 7 Drawing Sheets

OTHER PUBLICATIONS

H. Nakabata et al; *Fabrication of High Frequency SAW Filter Making Use of CVD Diamond Film*; (Japanese Article).

T. Shiosaki et al; High–Coupling and High–Velocity SAW Using ZnO and AlN Films on a Glass Substrate; *IEEE Transactions on Ultrasonics, Ferroelectrics, and Frequency Control UFFC–33*, (May 1986) pp. 324–330.

H. Nakahata et al; High–Frequency Surface Acoustic Wave Filter Using ZnO/Diamond/Si Structure; *2nd International Conference on the Applications of Diamond Films and Related Materials* (1993) pp. 361–364.

Yamunouchi et al; SAW Propagation Characteristics and Fabrication Technology of Piezoelectric Thin Film/Diamond Structure; *Ultrasonics Symposium* (1989) pp. 351–354.

H. Nakahata et al; High Frequency Surface Acoustic Wave Filter Using ZnO/Diamond/Si Structure; *Ultrasonics Symposium* (1992) pp. 377–380.

S. Shikata et al; High Frequency bandpass filter using polycrystalline diamond, *Diamond and Related Materials* 2, pp. 1197–1202 (1993).

Colin Campbell; *Surface Acoustic Wave Devices and Their Signal Processing Applications;* pp. 9–30. (1989).

M. W. Geis; Device quality diamond substrates, *Diamond and Related Materials*, 1 (1992) pp. 684–687.

S. D. Wolter; Textured Growth of Diamond on Silicon via In–situ Carburization and Bias–enhanced Nucleation, *Abstract.* Accepted Dec. 1992.

A One–Day Workshop on *Diamond Films* Science & Technology (Feb. 1, 1991).

M. W. Geis et al; *Production of Large–Area Mosaic Diamond Films Approaching Single–Crystal Quality*, pp. 605–607.

DIAMOND SURFACE ACOUSTIC WAVE DEVICES

FIELD OF THE INVENTION

The present invention relates to semiconductor devices, and more particularly, to surface acoustic wave (SAW) devices.

BACKGROUND OF THE INVENTION

Surface Acoustic Wave (SAW) devices are semiconductor devices that use surface acoustic waves whose energy is transmitted convergently on the surface of a solid. In general, a SAW device includes a layer of a piezoelectric material and one or more interdigitated transducer (IDT) electrodes formed on the piezoelectric layer. The surface acoustic wave may be excited by applying an electrical signal to an IDT electrode. Electrical signals are correspondingly generated across the opposite IDT electrode as surface acoustic waves pass the electrode. Typical piezoelectric materials include bulk monocrystals of quartz, as well as layers of $LiNbO_3$, $LiTaO_3$, AlN, or ZnO grown on a substrate.

In general, the active frequency (f) of a surface acoustic wave device is determined by the formula $f=v/\lambda$, where $\lambda$ is the wavelength and v is the propagation velocity of the surface acoustic wave in the piezoelectric material. The wavelength $\lambda$ is dependent on the spacing frequency of the interdigitated electrodes and the crystal orientation of the surface of the material through which the wave passes. Typical propagation velocities v for exemplary materials are as follows: 3500 m/sec to 4000 m/sec for a monocrystalline $LiNbO_3$ layer, and 3300 m/sec to 3400 m/sec for a monocrystalline $LiTaO_3$ layer. The propagation velocity v is relatively high at approximately 3000 m/sec for a ZnO film on a glass substrate.

The active frequency f can be increased either by increasing the propagation velocity v or by decreasing the wavelength $\lambda$. Unfortunately, the propagation velocity is restricted by the material properties of the piezoelectric layer. The wavelength $\lambda$, which is determined by the width, spacing, and arrangement of the IDT electrodes, is limited by the lower limits of existing processing technologies. In a typical interdigitated electrode having an array of alternating equally spaced electrode fingers with a common width w and a common spacing s, for example, the wavelength is determined by the formula $\lambda=2s+2w$. Other electrode arrangements will have other relationships between the wavelength, electrode width, and electrode spacing.

Submicron geometries may be difficult to fabricate using conventional materials, and long term reliability is limited by metal migration effects. For example, many existing optical lithography technologies cannot be used to fabricate a line/groove structure having a width of less than 0.8 µm. In addition, a narrower line width lowers the fabrication yield. For these reasons, the maximum frequency of many existing SAW devices in practical use is approximately 900 MHz.

A surface acoustic wave device having interdigitated electrodes on a $LiNbO_3$ substrate may have a surface acoustic wave velocity of 4003.6 m/s, a coupling coefficient of 5.57%, and a frequency temperature coefficient of −72 ppm/K, for example. In a device having alternating equally spaced interdigitated electrodes with 1 µm wide electrodes and 1 µm spaces between electrodes, the frequency will be approximately 1 GHz. In order to achieve a 2.5 GHz device, the electrodes would need to have a width and spacing of approximately 0.4 µm.

In the case of SAW devices including a piezoelectric film on a substrate, plural surface acoustic waves are excited if the sound velocity of the substrate is different than the surface acoustic wave velocity of the piezoelectric film. These surface acoustic waves are called zeroth mode waves, first mode waves, second mode waves, etc. according to the order of increasing velocity. The velocities of all modes depend on the substrate, as well as the piezoelectric film. The use of substrates having higher sound velocities results in higher velocities for all modes of the surface acoustic wave in the device. That is, the surface acoustic wave velocity increases in proportion to the sound velocity of the substrate.

A multilayer surface acoustic wave device is disclosed, for example, in a reference by Shiosaki et al. entitled *High-Coupling and High-Velocity SAW Using ZnO and AlN Films on a Glass Substrate*, and appearing in IEEE Transactions on Ultrasonics, Ferroelectrics, and Frequency Control, Vol. UFFC-33, No. 3, May 1986. The SAW device disclosed by the Shiosaki et al. reference includes a borosilicate glass sheet substrate, a C-axis-oriented AlN film on the substrate, and a C-axis-oriented polycrystalline ZnO film on the AlN film opposite the substrate. Aluminum IDT electrodes are included between the AlN and the ZnO films. With this structure, a maximum coupling coefficient of 4.37% was reportedly obtained where the phase velocity was 5840 m/s. The frequency temperature coefficient of this device was 21.0 ppm/°C. at 25° C. The phase velocity of this device, however, is still relatively low. Accordingly, high frequency performance is limited.

A surface acoustic wave device having a relatively higher propagation velocity is disclosed in U.S. Pat. No. 5,221,870 to Nakahata et al. The patent discloses a SAW device having a silicon semiconductor substrate, a diamond film on the substrate, a ZnO piezoelectric layer on the diamond layer, and interdigitated transducer electrodes on the piezoelectric layer. For the diamond film, both a single crystal and polycrystalline film are suitable. However, a monocrystalline film is more favorable, because there is less acoustic scattering in monocrystalline diamond as compared to polycrystalline diamond.

Diamond is a preferred material for many semiconductor devices because of its hardness, relatively large bandgap, high temperature performance, high thermal conductivity, and radiation resistance. Moreover, diamond is desirable for SAW devices because it has relatively large values of acoustic velocities. See, for example, "*SAW Propagation Characteristics and Fabrication Technology of Piezoelectric Thin Film/Diamond Structure*", by Yamanouchi et al., 1989 Ultrasonics Symposium, pp. 351–354, 1989. Moreover, combining diamond with relatively low velocity piezoelectric materials results in higher SAW velocities; thus, the demands on line spacing may be reduced for a given frequency of operation as disclosed, for example, in "*High Frequency Bandpass Filter Using Polycrystalline Diamond*", by Shikata et al., Diamond and Diamond Related Materials, 2 (1993), pp. 1197–1202.

U.S. Pat. No. 5,235,233 to Yamamoto and entitled *Surface Acoustic Wave Device* discloses a SAW device including diamond, an AlN layer on the diamond layer and IDT electrodes on the AlN layer. In another embodiment, an intervening layer of $SiO_2$ is provided between the diamond and AlN layers. High electromechanical coupling coefficients and high phase velocities are reportedly provided by the devices.

To further monitor and control the temperature of a diamond SAW device, U.S. Pat. No. 5,235,236 to Nakahata et al. and also entitled *Surface Acoustic Wave Device* discloses a thermistor formed by a semiconducting diamond layer which, in turn, is supported on an insulating diamond layer of the SAW device. The thermistor cooperates with a heater to control the operating temperature of the SAW device.

U.S. Pat. No. 4,952,832 to Imai et al. entitled *Surface Acoustic Wave Device* also discloses a SAW device including polycrystalline or single crystal diamond that may be used as a filter, a resonator, a delay line or a signal processing device and a convolver. See U.S. Pat. Nos. 5,221,870 and 5,160,869 both to Nakahata et al.; *High-Frequency Surface Acoustic Wave Filter Using ZnO/Diamond/Si Structure*, by Nakahata et al., from the International Conference on the Applications of Diamond Films and Related Materials, pp. 361–364, (1993); and *High-Frequency Surface Acoustic Wave Filter Using ZnO/Diamond/Si Structure*, by Nakahata et al., 1992 Ultrasonics Symposium, pp. 377–380, (1992).

The device of the Nakahata et al. U.S. Pat. No. 5,221,870, for example, may have a relatively high surface acoustic wave velocity of more than 10,000 m/sec. Accordingly, the high surface acoustic wave velocity v reduces the necessity of fine IDT electrodes. In particular, Nakahata et al. discloses that IDT electrodes having a line width of 1 μm and a spacing of 1 μm may produce a surface acoustic wave with a frequency as high as 2 GHz. However, a polycrystalline diamond film may produce acoustic scattering and may require polishing. A single crystal diamond film may provide better performance, however, single crystal may be expensive and difficult to produce.

SUMMARY OF THE INVENTION

In view of the foregoing background, it is therefore an object of the present invention to provide a surface acoustic wave device capable of operating at relatively high frequencies and at high temperatures.

It is another object of the present invention to provide a high frequency surface acoustic wave device having interdigitated transducer electrodes permitting relatively large line widths and spacings to thereby increase reliability, yield, and ease of fabrication.

It is yet another object of the present invention to provide a surface acoustic wave device including diamond and having high performance characteristics approaching those of single crystal diamond without the relatively high cost of single crystal diamond.

These and other objects, features and advantages according to the present invention are provided by a surface acoustic wave device including in one embodiment a highly oriented diamond layer, a piezoelectric layer on the highly oriented diamond layer, and at least one interdigitated transducer electrode on the piezoelectric layer. Because of the relatively high wave propagation velocity of diamond, a 1 μm line and space geometry, for example, may be used to fabricate SAW devices that operate at frequencies in excess of 2.5 GHz. Higher frequencies may be achieved by using submicron geometries.

The highly oriented diamond layer preferably includes a plurality of side-by-side columnar diamond grains each oriented relative to one another and with a tilt and azimuthal misorientation of less than about 8°. The highly oriented diamond is preferably formed on a nondiamond single crystal substrate having a relatively close lattice match to diamond, such as for example, silicon carbide, copper, nickel and alloys thereof.

The highly oriented diamond layer has advantages over conventional polycrystalline or single crystal diamond films. The highly oriented diamond film is smoother than a polycrystalline film thereby reducing any need to polish the diamond film. Polishing may cause mechanical or chemical-mechanical damage to a diamond layer. In preferred embodiments, the surface roughness of the highly oriented diamond film may be less than 200 Å RMS.

The highly oriented diamond layer may also reduce acoustic scattering when compared to a conventional polycrystalline film. This reduction in scattering may be attributed to the smoothness of the surface and the alignment of the grain boundaries. The highly oriented diamond film is also less expensive than a single crystal diamond film. Accordingly, low cost, large area, and well controlled mirror smooth surfaces may be obtained in surface acoustic wave devices having a highly oriented diamond film according to one aspect of the present invention.

The interdigitated electrodes may be positioned either between the highly oriented diamond layer and the piezoelectric layer or on the piezoelectric layer opposite the diamond layer. A ground plane electrode may be positioned on the piezoelectric layer opposite the interdigitated electrode, or it may be positioned on the diamond layer opposite the piezoelectric layer.

Advantages may also be achieved by isolating the surface acoustic waves to the diamond film. This isolation may be achieved by forming two laterally spaced apart piezoelectric layer portions on a diamond layer and transmitting surface acoustic waves across the diamond layer between the two piezoelectric layers. In such a device, the velocity of the acoustic wave may be greater than through both a diamond layer and a piezoelectric material layer.

Yet another aspect of the invention permits conventional metal interdigitated transducer electrodes to be replaced or augmented by a predetermined pattern of electrically conductive highly doped surface portions of the diamond layer adjacent the piezoelectric layer. The highly doped diamond surface portions preferably comprise highly boron doped surface portions having boron concentrations of greater than about $10^{19}$ atoms $cm^{-3}$. The highly doped diamond surface portions may also increase the adhesion and performance of a corresponding pattern of metal lines formed on the highly doped surface portions.

Undesirable reflections of surface acoustic waves may be reduced by providing diamond and piezoelectric layers having respective opposing ends which are canted at an angle from orthogonal to an axis of surface acoustic wave propagation. The reflections may also be further reduced by providing acoustic absorbers adjacent the ends of the device. An acoustic absorber may also be included adjacent an end of the piezoelectric layer. The acoustic absorber may comprise a resistor on the piezoelectric layer, or a doped diamond resistor formed adjacent the piezoelectric layer.

The SAW device may include first and second interdigitated electrodes on the piezoelectric layer in laterally spaced apart relation such as to define a SAW filter. By providing first and second interdigitated electrodes, an insulating layer on the piezoelectric layer positioned between the first and second interdigitated electrodes, a semiconducting layer on the insulating layer, and a pair of amplification electrodes on the semiconducting layer, the SAW device defines an amplifier. Alternately, first and second interdigitated electrodes on the piezoelectric layer, a third electrode on the piezoelectric layer between the first and second interdigitated electrodes, and a fourth electrode on the diamond layer opposite the third electrode define a convolver or a phase-shifter.

The piezoelectric layer may be a layer of ZnO, AlN, $PbZrO_3$, $PbTiO_3$, $LaZrO_3$, $LaTiO_3$, $LiTaO_3$, $LiNbO_3$, $SiO_2$, $Ta_2O_5$, $Nb_2O_5$, BeO, $Li_2B_4O_7$, $KnbO_3$, ZnS, ZnSe, or GaAs. A substrate may also be included on the highly oriented diamond layer opposite the piezoelectric layer.

A method according to the present invention is for making or fabricating a SAW device as described above. The method preferably includes the steps of forming a highly oriented diamond layer; forming a piezoelectric layer on the highly oriented diamond layer; and forming at least one interdigitated electrode on the piezoelectric layer. The step of forming the highly oriented diamond layer preferably includes forming, on a single crystal nondiamond substrate, a diamond layer comprising a plurality of side-by-side columnar diamond grains each oriented relative to one another and with a tilt and azimuthal misorientation of less than about 8°.

The step of forming the piezoelectric layer, in one embodiment, includes forming first and second piezoelectric layer portions on the diamond layer in laterally spaced apart relation. Accordingly, the step of forming the interdigitated electrode comprises forming first and second interdigitated electrodes on respective first and second piezoelectric layer portions. The step of forming the interdigitated electrodes in another embodiment of the invention preferably includes forming a predetermined pattern of electrically conductive highly doped surface portions of the diamond layer adjacent the piezoelectric layer. The step of forming the piezoelectric layer also preferably includes forming the piezoelectric layer to have opposing ends canted at an angle from orthogonal to the axis of surface acoustic wave propagation to reduce undesirable wave reflections.

DETAILED DESCRIPTION OF PREFERRED EMBODIMENT

Figure 1:
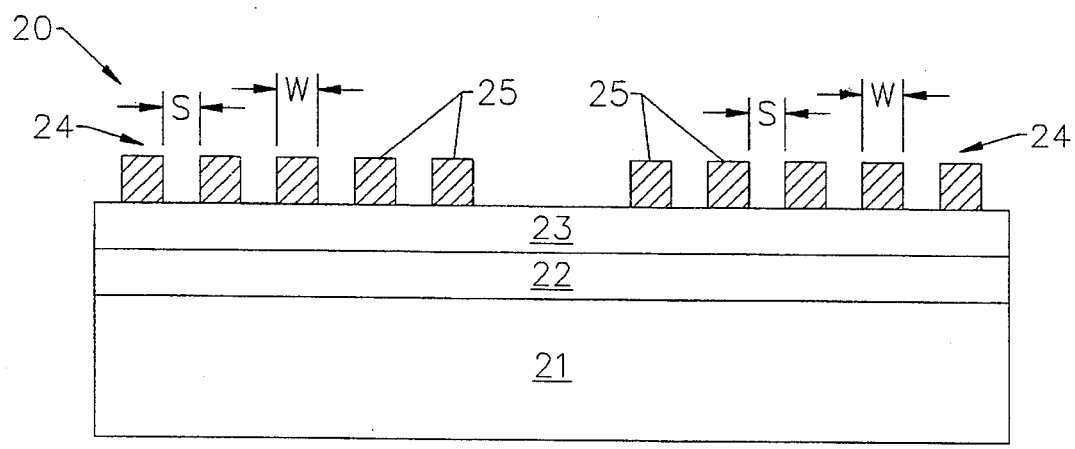
FIG. 1 is a schematic cross-sectional view of a surface acoustic wave device according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout and prime notation is used to indicate like elements in various embodiments.

Figure 2:
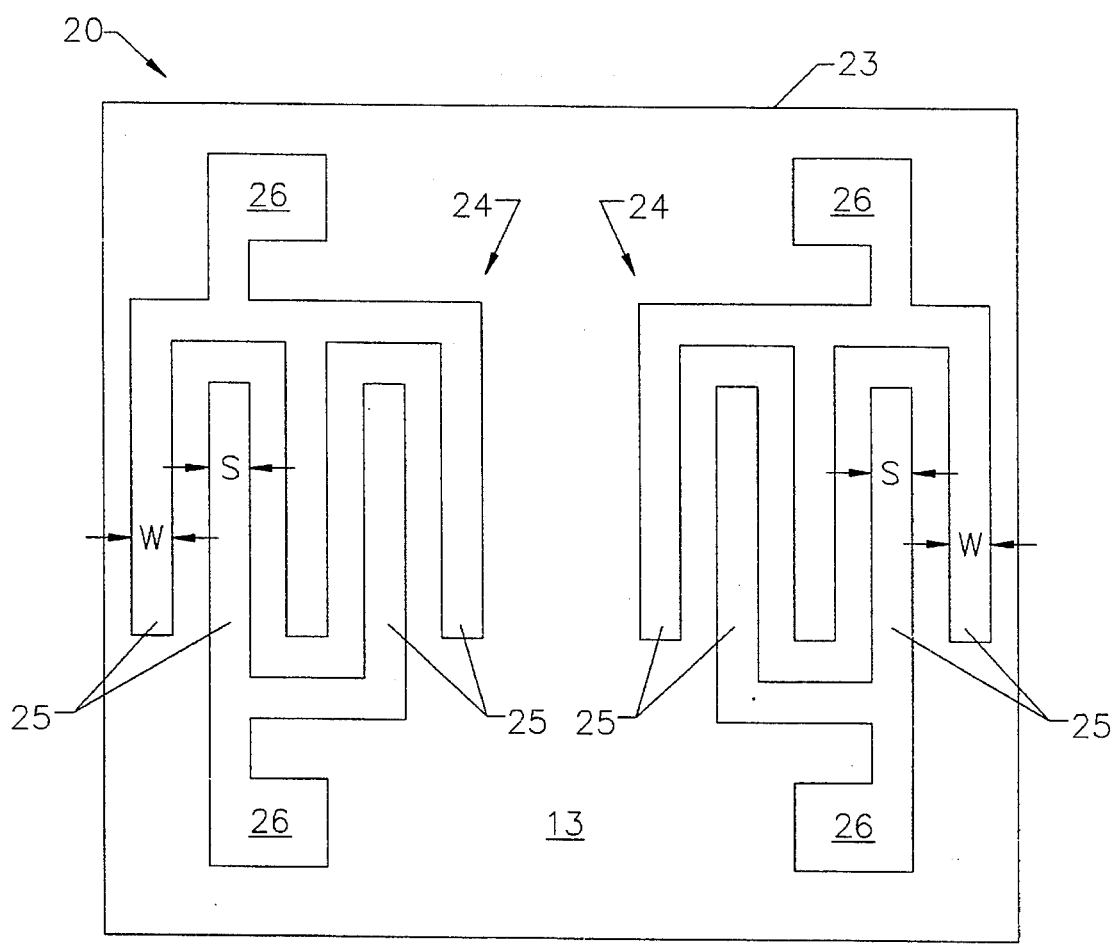
FIG. 2 is schematic plan view of the surface acoustic wave device as shown in FIG. 1.

One embodiment of a surface acoustic wave device according to the invention is the SAW filter 20 as illustrated in FIGS. 1 and 2. The SAW filter 20 includes a substrate 21, a highly oriented diamond layer 22 on the substrate, a piezoelectric layer 23 on the diamond layer, and a pair of interdigitated transducer electrodes 24 on the piezoelectric layer. Alternately, the substrate may be removed from the diamond layer 22. In the illustrated embodiment, the IDT electrodes 24 are formed from a patterned conductive metal layer as would be readily understood by those skilled in the art. Each IDT transducer electrode 24 includes a plurality of spaced apart metal fingers 25. Each finger 25, in turn, has a width w, and the spacing between adjacent fingers is indicated by s. Contact pads 26 (FIG. 2) facilitate external connection to the interdigitated electrodes 24.

In the illustrated configuration, the frequency of the SAW filter 20 is determined by the formula $f=v/\lambda$. With a ZnO piezoelectric layer 23 on a diamond layer 22, in turn, positioned on a silicon substrate 21, for example, v=10,200 m/s, and $\lambda=2s+2w$. Accordingly, if s=1 μm and w=1 μm, the frequency will be approximately 2.5 GHz. This high frequency SAW filter 20 may be readily manufactured using conventional high capacity photolithography equipment to form the IDT electrodes 24. SAW devices capable of operating at still higher frequencies may be obtained by using submicron geometries.

In alternate configurations, the interdigitated transducer electrodes may transmit surface acoustic waves either unidirectionally or bidirectionally. As shown in FIG. 2, alternating electrode fingers may be connected to opposite side portions of the electrode. Alternately, two or more adjacent electrode fingers may be connected to the same side portion of the electrode. Furthermore, the width of fingers and the spacings between fingers may be varied. Accordingly, various configurations of interdigitated electrodes will be readily appreciated by one having skill in the art. The SAW device may also include floating fingers and/or reflection gratings comprising shallow grooves, pedestals, or thin-film metal strips as would be readily understood by those skilled in the art.

The piezoelectric layer 23 may preferably comprise ZnO, AlN, $PbZrO_3$, $PbTiO_3$, $PbZrO_3$, $PbTiO_3$, $LaZrO_3$, $LaTiO_3$, $LiTaO_3$, $LiNbO_3$, $SiO_2$, $Ta_2O_5$, $Nb_2O_5$, BeO, $Li_2B_4O_7$, $KNbO_3$, ZnS, ZnSe, or GaAs.

Figure 3:
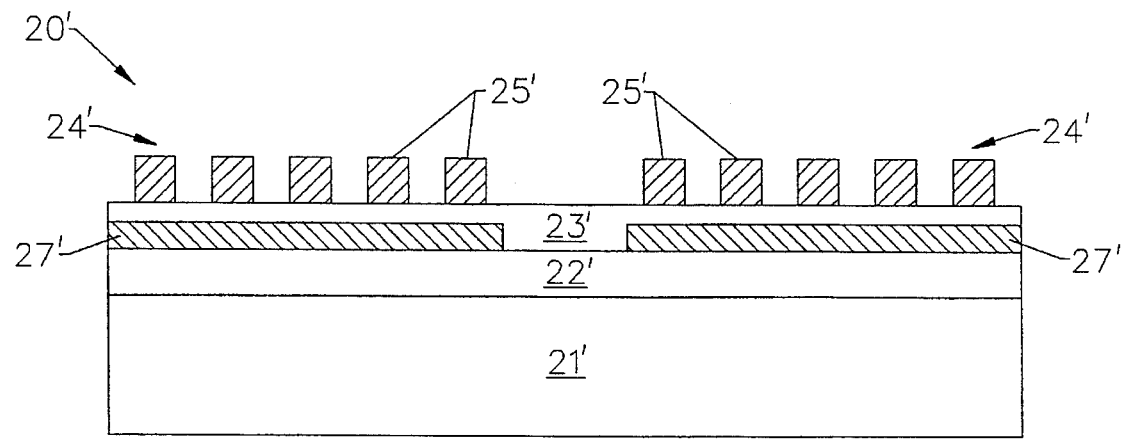
FIG. 3 is a schematic cross-sectional view of another embodiment of a surface acoustic wave device according to the present invention.

As shown in FIG. 3, in another embodiment of the SAW filter 20', the interdigitated electrodes 24' are positioned on the piezoelectric layer 23' opposite the diamond layer 22'. In addition, respective ground plane electrodes 27' are illustratively positioned between the diamond layer 22' and the substrate 21' The electrodes may comprise doped portions of the diamond layer, conductive portions of the substrate, or separate conductive layers.

Figure 4:
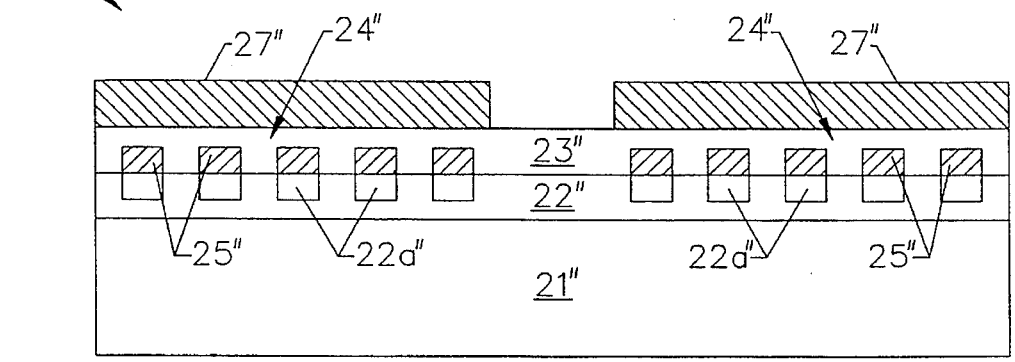
FIG. 4 is a schematic cross-sectional view of yet another embodiment of a surface acoustic wave device according to the present invention.

Yet another embodiment of the SAW filter 20" is shown in FIG. 4. In this embodiment, the positions of the interdigitated electrodes 24" and the ground electrodes 27" are changed from FIG. 3. The interdigitated electrodes 24" are between the diamond layer 22" and the piezoelectric layer 23", and the ground plane electrodes are on the piezoelectric layer opposite the diamond layer.

FIG. 4 also illustrates another aspect of the present invention, wherein the SAW filter 20" includes highly doped surface portions 22a" of the diamond layer 22". These highly doped surface portions 22a" are preferably doped with a dopant, such as boron, to a concentration of not less than about $10^{19}$ cm$^{-3}$. These highly doped diamond portions may be achieved by implanting boron and etching graphitized diamond as disclosed in U.S. Pat. No. 5,254,862 to Das et al. entitled, "Diamond Field Effect Transistor with a Particular Boron Distribution Profile", the entire disclosure of which is incorporated herein by reference. The highly doped surface portions 22a" provide better ohmic contact between the diamond layer 22" and the metal fingers 25". Considered in slightly different terms, the highly doped surface portions 22a" form a part of the interdigitated electrodes 24" Moreover, the highly doped surface portions 22a" may be used alone as the interdigitated electrodes, without requiring the illustrated electrically conductive fingers 25".

The diamond layer for each of the SAW filter embodiments may preferably be provided by a highly oriented diamond layer having a plurality of side-by-side columnar diamond grains oriented relative to one another and with a tilt and azimuthal misorientation of less than about 8°. Since the surface of this highly oriented diamond layer is smooth, extensive polishing will not be required, and the fabrication process is simplified. In addition, diamond has the advantages of a large thermal conductivity, a low dielectric constant, a high Young's modulus, and a high SAW velocity.

Diamond's high thermal conductivity results in improved thermal management allowing a diamond device to handle more power than a comparable conventional semiconductor device. A low dielectric constant may help in impedance matching of surface acoustic wave devices into electronic circuits. Furthermore, diamond is inert to most chemicals and chemical reactions making it ideally suited for use in hazardous environments.

Figure 5A:
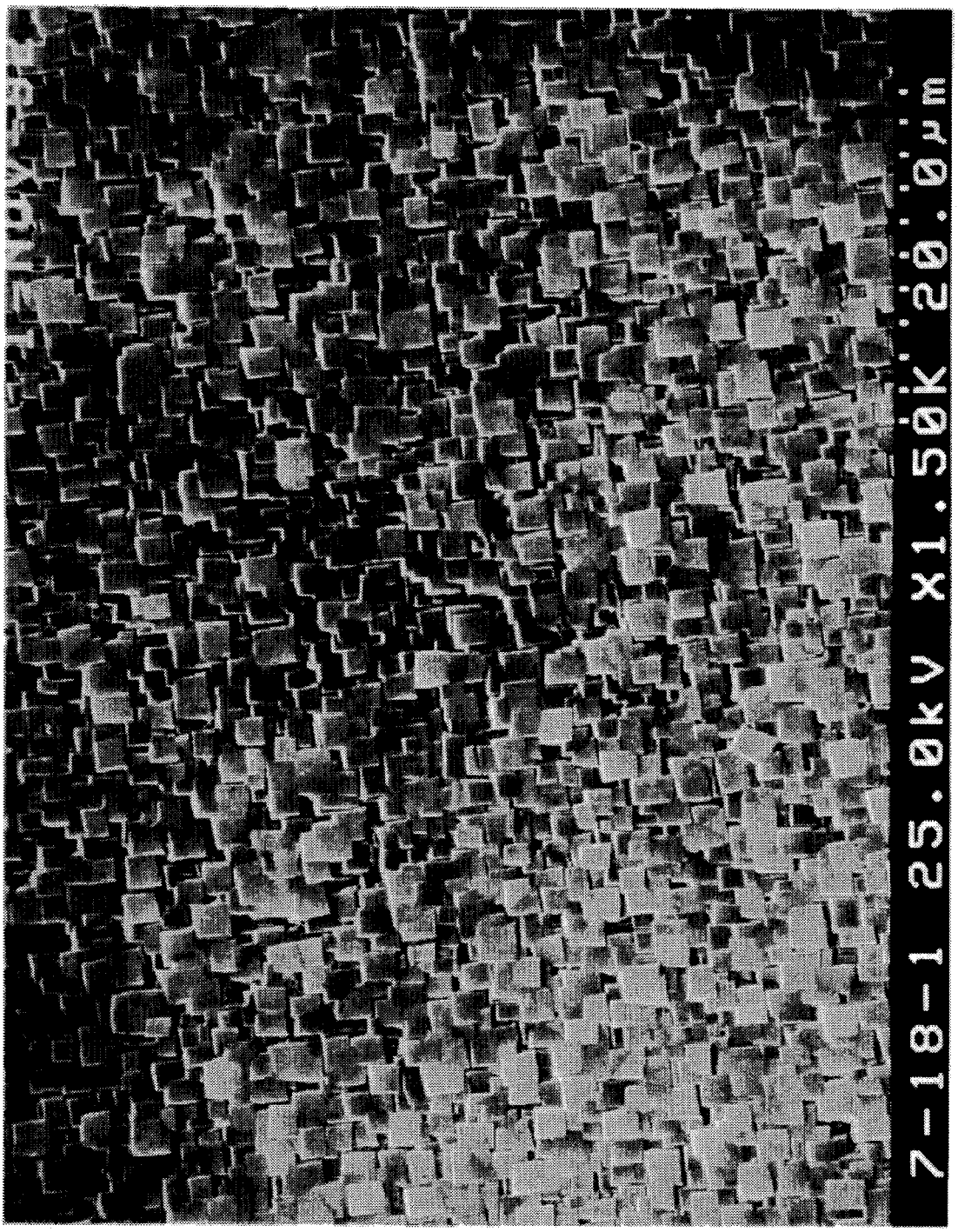
FIGS. 5a and 5b are photomicrographs of a highly oriented diamond layer which may be used in the surface acoustic wave devices according to the invention.
Figure 5B:
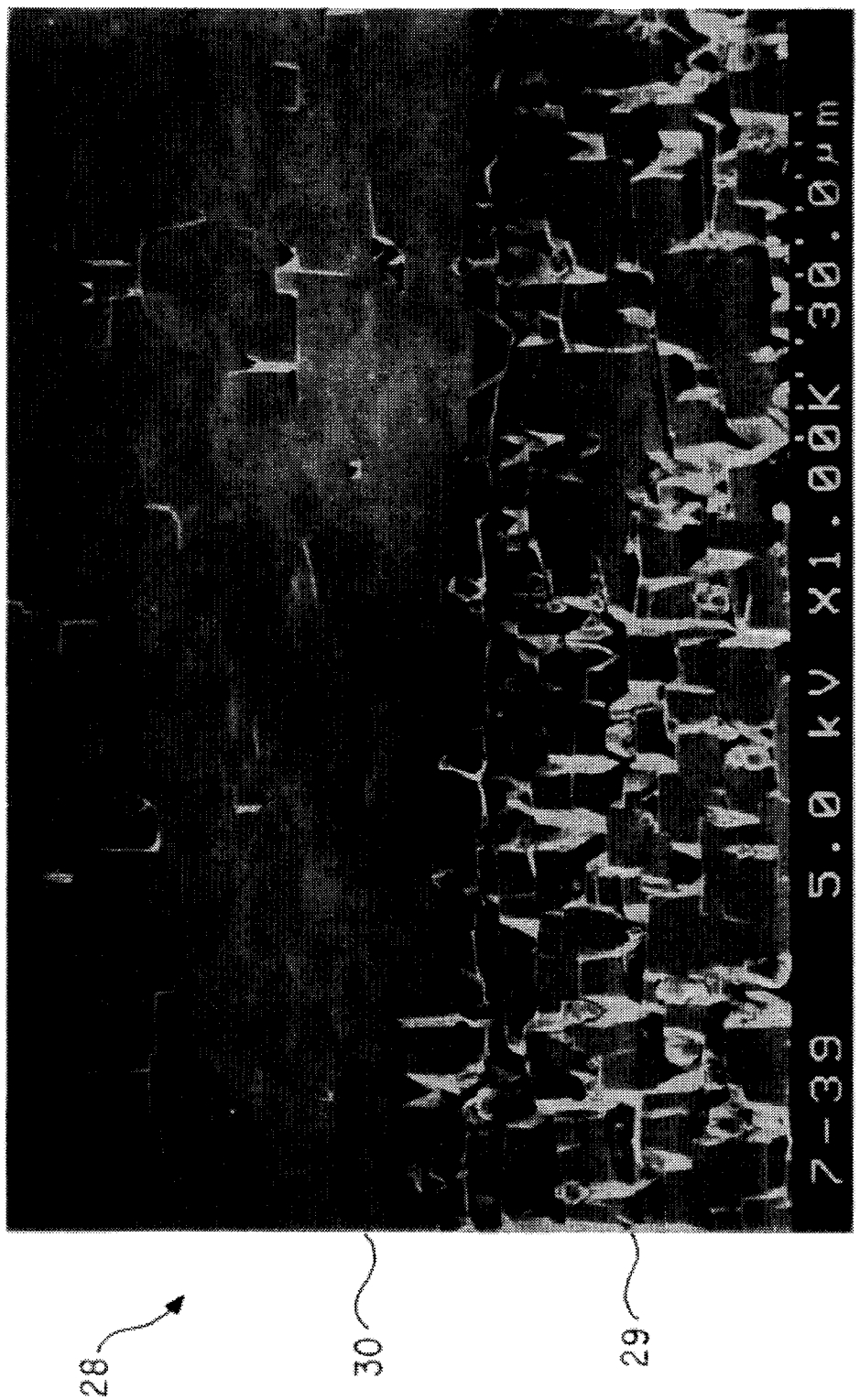

FIG. 5a is a photomicrograph illustrating a highly oriented diamond layer 22, wherein not only are the exposed faces parallel, but they are also rotationally aligned thereby permitting grain boundaries to substantially disappear with continued diamond growth as shown in FIG. 5b. The highly oriented diamond layer 22 is further described in copending U.S. patent applications Ser. No. 08/035,643, filed on Mar. 23, 1993 entitled *Microelectronic Structures on a Nondiamond Substrate and Associated Fabrication Methods* and Ser. No. 08/166,408, filed on Jan. 13, 1993 entitled *Electrochemical Cell Having Diamond Electrode And Methods For Making Same*, both assigned to the assignee of the present invention, the entire disclosures of which are hereby incorporated herein by reference.

The highly oriented diamond layer 22 includes a plurality of side-by-side columnar single crystal diamond grains extending outwardly from the nondiamond substrate 21. Substantially all of the columnar single crystal diamond grains are preferably oriented with a tilt and azimuthal misorientation of less than about 8°, and more preferably, less that about 5° relative to the single crystal nondiamond wafer. The diamond nucleation site density, or concentration is also relatively high, that is, greater than about $10^4$/cm$^2$ and, more preferably, greater than about $10^5$/cm$^2$. The method for making the highly oriented diamond layer includes carburizing the wafer surface, nucleating the carburized wafer, and growing diamond onto the nucleated wafer to favor growth of the (100)-oriented face. In addition, a carbide interfacial layer is preferably formed between the highly oriented diamond layer 22 and the nondiamond substrate 21 (not shown).

Nucleating the carburized wafer face preferably includes exposing the wafer face to a carbon containing plasma while electrically biasing another diamond layer adjacent the wafer face and which is also exposed to the plasma. The electrical biasing is preferably carried out at a peak absolute value of not less than about 250 volts negative with respect to ground. The electrical bias supplied may be pure DC, pulsed DC, alternating current (AC 50 or 60 Hz), or radio frequency (RF).

Without wishing to be bound thereto, applicants theorize that the adjacent diamond layer contributes to the enhancement of diamond nucleation either of two mechanisms. First, it is theorized that the diamond is chemically transported from the adjacent diamond film to the wafer. In other words, it is possible that the diamond is being moved from the diamond film adjacent the wafer face via an etching and deposition process. A second theory is that increased gas phase dissociation is caused by electron emission from the diamond film and that a higher concentration of dissociated hydrocarbons are being created by this electron dissociation process.

Exposing both the nondiamond wafer and the adjacent diamond layer to the carbon-containing plasma preferably includes exposing both to the carbon-containing plasma having an atomic percentage of carbon of not more than about 0.3 atomic percent, such as provided by a methane gas plasma mixture having a percentage of methane of not more than about 5 percent by weight. The face of the wafer may also preferably be optically monitored and the electrical biasing discontinued responsive to a change in the substrate indicative of the start of growth of a diamond film on the wafer. For example, laser reflection interferometry or optical pyrometry may be used to monitor the face of the substrate.

Diamond is preferably deposited onto the wafer while controlling processing conditions to favor growth of diamond having a (100)-oriented outer face. Other orientations for the outer face are also possible to achieve and may be desirable in certain applications. For example, (110) and (111) orientations may also be readily obtained by controlling diamond growth conditions to favor these orientations as would be readily understood by those skilled in the art.

The highly oriented diamond layer 22 permits the use of a relatively inexpensive wafer or substrate material, such as silicon, on which a high quality diamond layer may be formed. Diamond may be further deposited onto the highly oriented diamond layer, as would be readily appreciated by those skilled in the art, until a single crystal surface morphology were approached by outer portions of the diamond layer as shown in FIG. 5b. In FIG. 5b, a highly oriented diamond layer 28 is illustrated in a photomicrograph taken from a prospective view showing both a cross-section 29 and an upper surface 30 of the layer. The surface 30 of this layer approaches a single crystal morphology.

The highly oriented diamond layer also has the advantage of reducing acoustic scattering because of the alignment of grain boundaries and the smoothness of the surface. The alignment of the diamond crystals reduces any need to polish the surface of the diamond film. The alignment of the crystals also reduces voids in the diamond layer.

Figure 6:
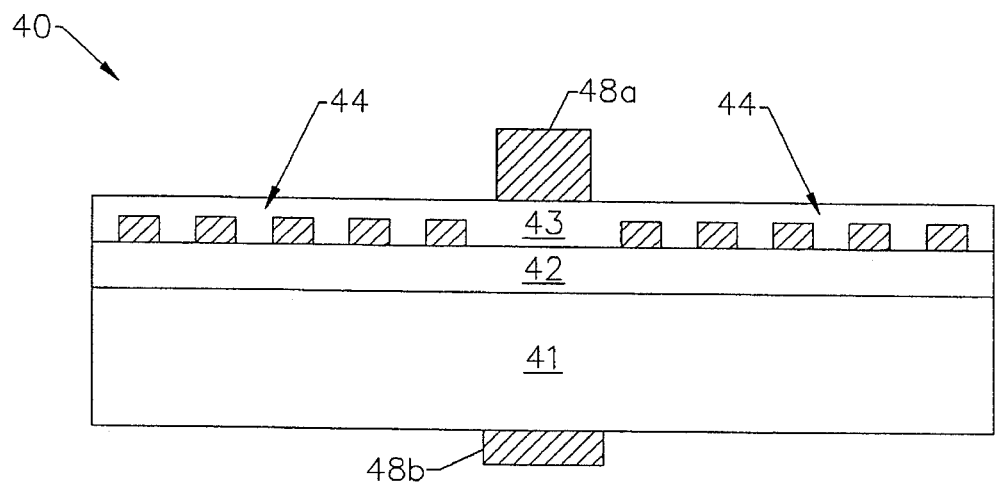
FIG. 6 is a schematic cross-sectional view of a diamond surface acoustic wave phase shifter or convolver according to the invention.

Referring now to FIG. 6, there is illustrated a surface acoustic wave device 40 which may be used as either a phase-shifter or a convolver. This surface acoustic wave device includes a substrate 41, a diamond layer 42, a piezoelectric layer 43, interdigitated transducer electrodes 44, and first and second electrically conductive layers 48a and 48b. As will be readily understood by those having skill in the art, the interdigitated electrodes 44 may be located on the piezoelectric layer opposite the diamond layer. In addition, the interdigitated electrodes 44 may alternately be provided by highly doped surface portions of the diamond layer 42. The device may also include ground plane electrodes not shown in this illustration. In the illustrated embodiment, the substrate 41 is also electrically conductive and cooperates with the electrically conductive layer 48b to define a second electrode.

When configured as a phase-shifter, the surface acoustic wave device 40 of FIG. 6 operates as follows. A voltage is applied between the electrodes or electrically conductive layers 48a and 48b. An electric field induced in the semiconductor substrate 41 and diamond layer 42 changes the state of carriers. Thus, the capacitance between the electrodes is varied by the electric field. The change of the capacitance varies the deformation-voltage property of the piezoelectric layer 43. If the first or gate electrode 48a is positively biased with respect to the lower electrode 48b, the carriers in the semiconductor substrate increase and the semiconductor loses its resistivity. Accordingly, the insulating diamond alone contributes to the capacitance between the electrodes 48a and 48b, and the capacitance increases. If the gate electrode is negatively biased with respect to the lower electrode, the number of carriers in the semiconductor decrease, and the capacitance decreases. Accordingly, the phase velocity of a surface acoustic wave propagating in the piezoelectric layer 43 changes in response to the change of capacitance.

When the semiconductor device 40 is configured as a convolver, both interdigitated electrodes 44 generate surface acoustic waves. Each surface acoustic wave propagates from a respective interdigitated electrode to the central portion of the piezoelectric layer 43. The two surface acoustic waves collide with each other in the central portion. The collision of the two waves induces a voltage across the electrodes provided by the electrically conductive layers 48a and 48b which is proportional to the product of the wave functions of the two surface acoustic waves. The output voltage across electrodes is in proportion to the convolution of the two surface acoustic waves. The frequency of the output wave is the sum of the frequencies of the two input waves.

Figure 7:
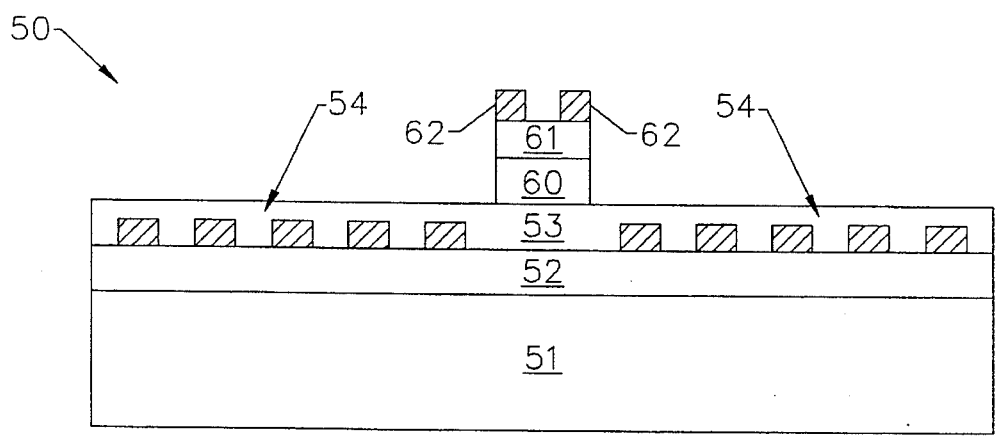
FIG. 7 is a schematic cross-sectional view of a diamond surface acoustic wave amplifier according to the invention.

FIG. 7 illustrates a surface acoustic wave amplifier 50 including a substrate 51, a diamond layer 52, a piezoelectric layer 53, and interdigitated electrodes 54. In addition, the amplifier 50 includes an insulating layer 60 on the piezoelectric layer 53 between the interdigitated electrodes 54. A semiconducting layer 61 is on the insulating layer 60, and a pair of amplification electrodes 62 are, in turn positioned on the semiconducting layer 61. As will be understood by those having skill in the art, the amplifier may also include ground plane electrodes not shown.

An electrical signal for controlling the amplification is applied across the amplification electrodes 62 to induce an electric field in the semiconductor layer 61. The electrical signal is preferably a pulsed signal to thereby induce a pulsed electric field in the semiconductor layer 61. An alternating current (AC) electrical signal is applied to one of the two interdigitated electrodes 54 to generate surface acoustic waves in the piezoelectric layer 53. The frequency of the surface acoustic wave is related to the frequency of the AC signal which is applied to the interdigitated electrode.

The surface acoustic waves propagate in the piezoelectric layer 53 from one interdigitated electrode to the other interdigitated electrode to produce a periodically varying electric field. The carriers in the semiconductor film 61 are affected by this electric field as follows. If the carrier velocity in the semiconductor layer 61 is higher than the surface acoustic wave velocity, the carriers are pulled backward and decelerated by the electric field thereby amplifying the surface acoustic wave. If the carrier velocity is lower than the surface acoustic wave velocity, the carriers are pulled forward and accelerated by the electric field induced by the surface acoustic wave thereby attenuating the surface acoustic wave. The rate of amplification or attenuation is controlled by the carrier velocity which is determined by the pulsed electrical signal applied to the amplification electrodes.

Another embodiment of the surface acoustic wave filter according to the invention is explained with reference to FIG. 8. The embodiment includes a substrate 71, a diamond layer 72, a pair of interdigitated electrodes 74, and a pair of spaced apart piezoelectric layers 73a, 73b. In other words, a gap 79 is defined between laterally spaced apart piezoelectric layer portions 73a, 73b. The filter may also include ground plane electrodes not shown.

In this SAW device 70, surface acoustic waves are generated by electrical signals applied to one or both of the interdigitated electrodes 74. Unlike the previously discussed embodiments where the surface acoustic wave travels through both the piezoelectric layer and the diamond layer, in the SAW filter 70 of FIG. 8, the wave propagates only through the diamond layer. The surface acoustic wave propagation characteristics are thus determined by the diamond layer rather than the combination of the diamond layer and the piezoelectric layer. Accordingly, the surface acoustic waves may propagate at a higher velocity between the IDT electrodes 74.

Figure 9:
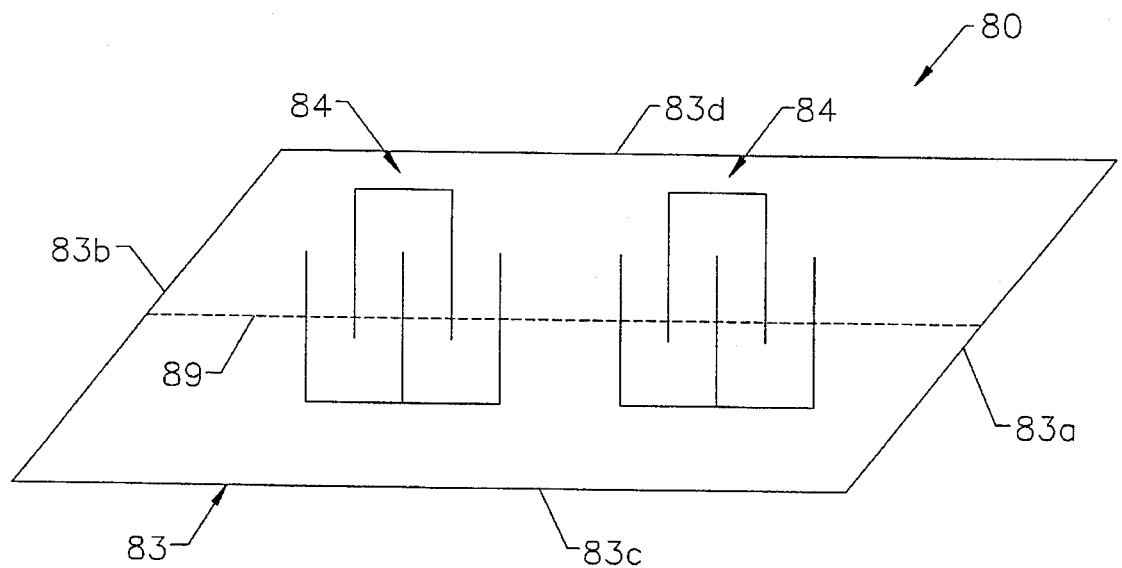
FIG. 9 is schematic plan view of a diamond surface acoustic wave device having canted opposing ends according to the invention.
Figure 10:
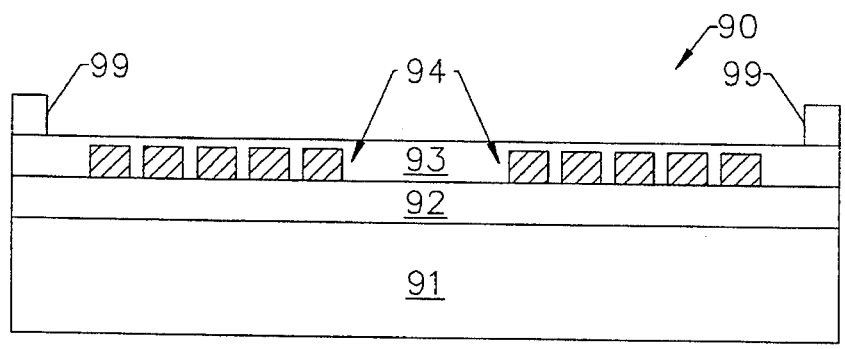
FIGS. 10–13 are schematic cross-sectional views of diamond surface acoustic wave devices having various arrangements of acoustic wave absorbers.

Yet another aspect of the present invention is illustrated in FIG. 9. The illustrated surface acoustic wave filter 80 includes a piezoelectric layer 83 overlying a diamond layer and substrate as described above with reference to FIGS. 1 and 2. The pair of IDT electrodes 84 define an axis of surface acoustic wave propagation 89 therebetween. In the illustrated embodiment of FIG. 9, the opposing ends 84a, 84b of the piezoelectric layer are canted at an angle from orthogonal to the axis of surface acoustic wave propagation 89 to reduce undesirable reflections. The surface acoustic wave device 80 may also have respectively opposing sides 83c, 83d parallel to the axis of acoustic wave propagation 89.

Other embodiments are also contemplated including only one end canted from orthogonal to the axis of propagation 89. In addition, the opposing ends 83a, 83b may be arranged to define a trapezoid rather than being parallel as in the illustrated embodiment of FIG. 9. While the interdigitated electrodes 84 are shown on the surface of the piezoelectric layer 83 opposite the diamond layer, the IDT electrodes may also be positioned between the diamond layer and the piezoelectric layer, or may be provided by highly doped diamond portions as discussed above.

Figure 11:
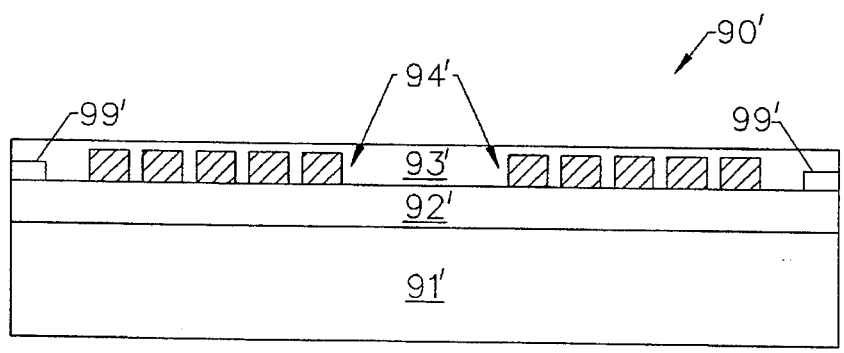
Figure 12:
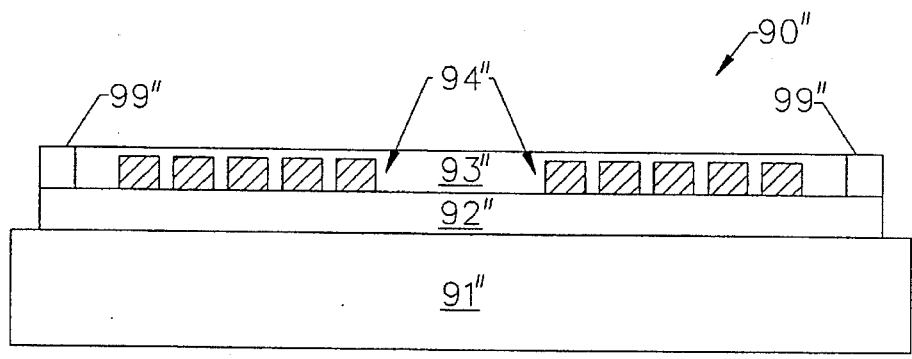
Figure 13:
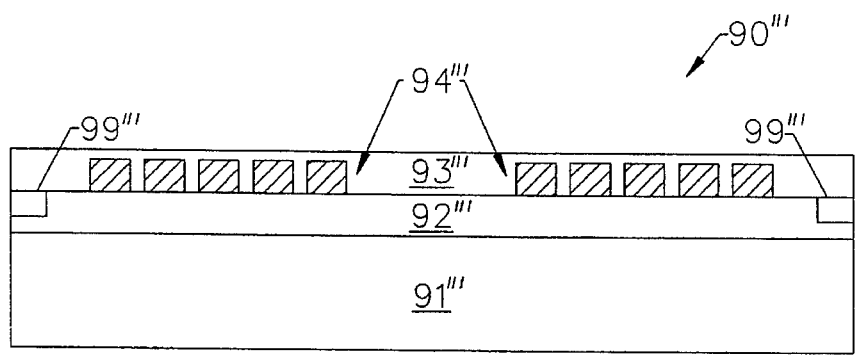

FIGS. 10–13 illustrate surface acoustic wave devices having various configurations of acoustic wave absorbers to reduce undesirable reflections. The surface acoustic wave device 90 shown in FIG. 10 includes a substrate 91, a diamond layer 92, piezoelectric layer 93, interdigitated electrodes 94, and an acoustic absorber 99 adjacent each end of the piezoelectric layer. In FIG. 11, the SAW filter 90' includes acoustic absorbers 99' on the diamond layer 92' and embedded in the piezoelectric layer 93'. In FIG. 12, the acoustic absorbers 99" are located on the diamond layer 92" at the ends of the piezoelectric layer 93". In FIG. 13, the acoustic absorbers 99''' are in the diamond layer 92''' as may be formed by a doped portion of the diamond layer defining a resistor as would be readily understood by those skilled in the art. In the other embodiments, each absorber 99 may comprise a resistor such as, for example, a metal resistor. In all of the embodiments illustrated in FIGS. 10–13, the acoustic absorber 99 reduces surface acoustic wave reflections by electrically terminating the end of the piezoelectric layer with a resistor.

Figure 14:
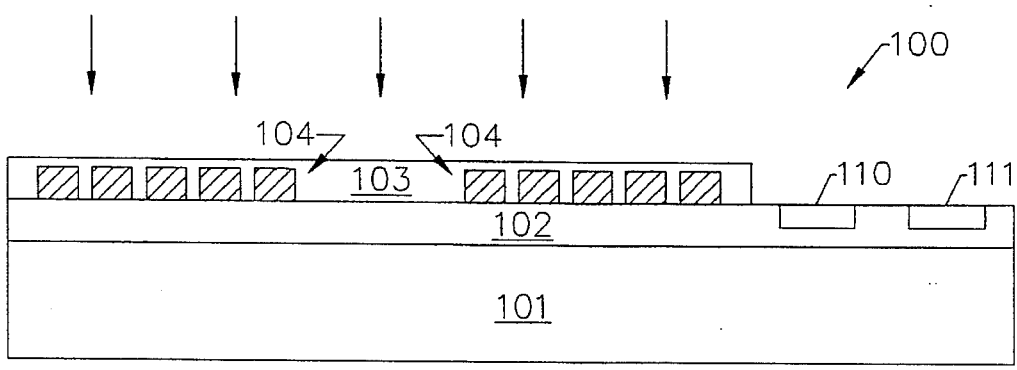
FIG. 14 is a schematic cross-section view of a diamond surface acoustic wave device including a thermistor and a heating resistor according to the invention.

Yet another aspect of the invention having a substrate 101, a diamond layer 102, interdigitated electrodes 104 and a piezoelectric layer 103 is illustrated in FIG. 14. A heating resistor 110 may be readily formed in the diamond layer 102 by ion implantation, for example. Moreover, the generated heat is readily conducted by the diamond layer 102. In addition, a semiconducting diamond thermistor 111 may also be formed to sense the temperature of the SAW device 100. The diamond resistor 110 and thermistor 111 may thus be used to maintain the device 100 at a predetermined temperature as would be readily understood by those skilled in the art.

A method according to the present invention is for making or fabricating a SAW device, such as described above with reference to FIGS. 1 and 2. The method preferably includes the steps of forming a highly oriented diamond layer 22 (FIGS. 5a and 5b); forming a piezoelectric layer 23 on the highly oriented diamond layer; and forming at least one interdigitated electrode 24 on the piezoelectric layer. The step of forming the highly oriented diamond layer 22 preferably includes forming, on a single crystal nondiamond substrate 21, a diamond layer comprising a plurality of side-by-side columnar diamond grains each oriented relative to one another and with a tilt and azimuthal misorientation of less than about 8°. The substrate may be removed from the diamond layer by chemical etching or other methods known to those having skill in the art.

Figure 8:
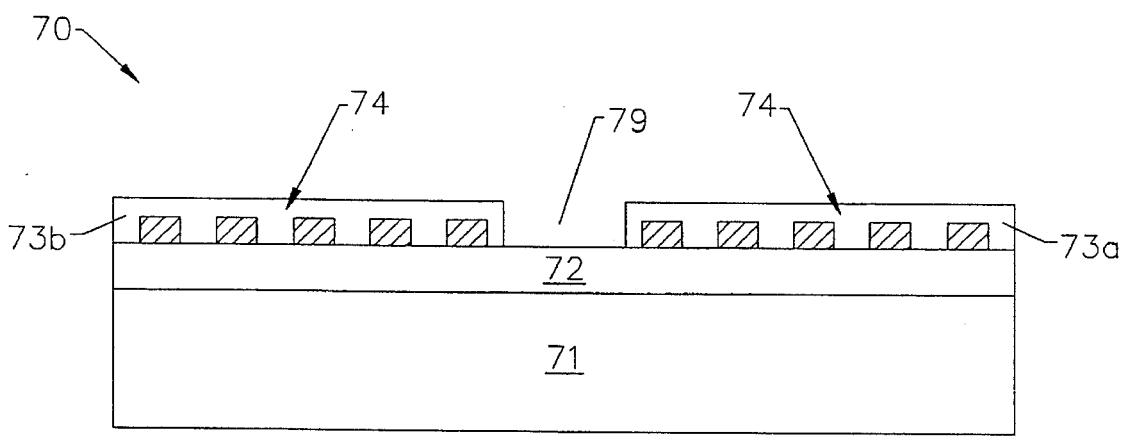
FIG. 8 is a schematic cross-sectional view of a diamond surface acoustic wave device having spaced apart piezoelectric layer portions according to the invention.

The step of forming the piezoelectric layer, in one embodiment as shown in FIG. 8, includes forming first and second piezoelectric layer portions 73a, 73b on the diamond layer 72 in laterally spaced apart relation. Accordingly, the step of forming the interdigitated electrodes comprises forming first and second interdigitated electrodes 74 on respective first and second piezoelectric layer portions.

As shown in FIG. 4, the step of forming the interdigitated electrodes 24" in another embodiment of the invention preferably includes forming a predetermined pattern of electrically conductive highly doped surface portions 22a" of the diamond layer 22" adjacent the piezoelectric layer 23".

Referring again to FIG. 9, the step of forming the piezoelectric layer 83 also preferably includes forming the piezoelectric layer to have opposing ends 83a, 83b canted at an angle from orthogonal to the axis of surface acoustic wave propagation 89 to reduce undesirable wave reflections.

A plurality of SAW devices may be manufactured by selective deposition of diamond in an array on a large area nondiamond wafer. The individual SAW devices may then be readily produced by dicing the nondiamond wafer along the lines as disclosed in U.S. Pat. No. 5,066,938 to Kobashi et al. and incorporated herein, in its entirety, by reference.

As would be readily understood by those skilled in the art, features of the various SAW device embodiments described above may be readily used in other embodiments. For example, the highly oriented diamond may be used in each of the devices including the SAW filter, chemical sensor, phase shifter, convolver, and amplifier. Other signal processing devices, such as delay lines, and resonators are also contemplated by the invention. Accordingly, many modifications and other embodiments of the invention will come to one skilled in the art having the benefit of the teachings presented in the foregoing descriptions and the associated drawings. Therefore, it is to be understood that the invention is not to be limited to the specific embodiments disclosed, and that modifications are intended to be included within the scope of the appended claims.

That which is claimed:

1. A surface acoustic wave device comprising:
  a highly oriented diamond layer comprising a plurality of side-by-side columnar diamond grains each oriented relative to one another and with a tilt and azimuthal misorientation of less than about 8°;
  a piezoelectric layer on said highly oriented diamond layer; and
  at least one interdigitated electrode on said piezoelectric layer;
  wherein said piezoelectric layer comprises first and second portions in laterally spaced apart relation, and wherein said at least one interdigitated electrode comprises first and second interdigitated electrodes on respective first and second piezoelectric layer portions.

2. A surface acoustic wave device according to claim 1 further comprising a single crystal nondiamond substrate on said highly oriented diamond layer opposite said piezoelectric layer.

3. A surface acoustic wave device according to claim 1 wherein said at least one interdigitated electrode is positioned between said highly oriented diamond layer and said piezoelectric layer.

4. A surface acoustic wave device according to claim 1 wherein said at least one interdigitated electrode is positioned on said piezoelectric layer opposite said highly oriented diamond layer.

5. A surface acoustic wave device comprising:
  a highly oriented diamond layer comprising a plurality of side-by-side columnar diamond grains each oriented relative to one another and with a tilt and azimuthal misorientation of less than about 8°;
  a piezoelectric layer on said highly oriented diamond layer; and
  at least one interdigitated electrode on said piezoelectric layer wherein said at least one interdigitated electrode comprises a predetermined pattern of electrically conductive highly doped surface portions of said diamond layer adjacent said piezoelectric layer.

6. A surface acoustic wave device according to claim 5 wherein said at least one interdigitated electrode comprises a pair of interdigitated electrodes on said piezoelectric layer adjacent opposing ends thereof, wherein said pair of interdigitated electrodes define an axis of surface acoustic wave propagation therebetween, and wherein said piezoelectric layer has opposing ends canted at an angle from orthogonal to the axis of surface acoustic wave propagation to reduce, undesirable wave reflections.

7. A surface acoustic wave device comprising:

a highly oriented diamond layer comprising a plurality of side-by-side columnar diamond grains each oriented relative to one another and with a tilt and azimuthal misorientation of less than about 8°;

a piezoelectric layer on said highly oriented diamond layer;

at least one interdigitated electrode on said piezoelectric layer; and an acoustic wave absorber adjacent at least one end of said piezoelectric layer wherein said acoustic wave absorber comprises a resistor on said piezoelectric layer and wherein said resistor comprises a doped diamond surface portion which is positioned on said piezoelectric layer so that said doped surface portion of said diamond layer defining a resistor electrically terminates said piezoelectric layer thereby reducing surface acoustic wave reflections.

8. A surface acoustic wave device comprising:

a highly oriented diamond layer comprising a plurality of side-by-side columnar diamond grains each oriented relative to one another and with a tilt and azimuthal misorientation of less than about 8°;

a piezoelectric layer on said highly oriented diamond layer;

at least one interdigited electrode on said piezoelectric layer wherein said at least one interdigitated electrode comprises first and second interdigitated electrodes on said piezoelectric layer in laterally spaced apart relation;

an insulating layer on said piezoelectric layer positioned between said first and second interdigitated electrodes;

a semiconducting layer on said insulating layer opposite said piezoelectric layer; and a pair of amplification electrodes on said semiconducting layer so that said surface acoustic wave device defines a surface acoustic wave amplifier.

9. A surface acoustic wave device comprising:

a highly oriented diamond layer comprising a plurality of side-by-side columnar diamond grains each oriented relative to one another and with a tilt and azimuthal misorientation of less than about 8°;

a piezoelectric layer on said highly oriented diamond layer;.

at least one interdigitated electrode on said piezoelectric layer wherein said at least one interdigitated electrode comprises first and second interdigitated electrodes on said piezoelectric layer in laterally spaced apart relation;

a third electrode on said piezoelectric layer between said first and second interdigitated electrodes; and a fourth electrode on said diamond layer opposite said third electrode so that the surface acoustic wave device defines one of a surface acoustic wave convolver and a surface acoustic wave phase-shifter.

10. A surface acoustic wave device according to claim 9 wherein said at least one interdigitated electrode comprises a plurality of electrically conductive lines each having a width of not less than about 1 μm and a spacing between adjacent lines of not less than about 1 μm.

11. A surface acoustic wave device according to claim 10 wherein each of said electrically conductive lines comprises one of aluminum, gold, platinum, a refractory metal, and alloys thereof.

12. A surface acoustic wave device according to claim 5 wherein said piezoelectric layer comprises one of ZnO, AlN, $PbZrO_3$, $PbTiO_3$, $LaZrO_3$, $LaZrO_3$, $LiTaO_3$, $LiNbO_3$, $SiO_2$, $Ta_2O_5$, $Nb_2O_5$, BeO, $Li_2B_4O_7$, ZnS, ZnSe, and GaAs.

13. A surface acoustic wave device according to claim 5 further comprising a ground plane electrode on at least one of said highly oriented diamond layer and said piezoelectric layer.

14. A surface acoustic wave device according to claim 5 further comprising a thermistor formed in said highly oriented diamond layer.

15. A surface acoustic wave device comprising:

a diamond layer;

first and second piezoelectric layer portions on said diamond layer in laterally spaced apart relation; and first and second interdigitated electrodes on respective first and second piezoelectric layer portions;

wherein said first and second interdigitated electrodes define an axis of surface acoustic wave propagation therebetween, and wherein said piezoelectric layer portions have respective opposing ends canted at an angle from orthogonal to the axis of surface acoustic wave propagation to reduce undesirable wave reflections.

16. A surface acoustic wave device according to claim 15 wherein said diamond layer comprises a highly oriented diamond layer having a plurality of side-by-side columnar diamond grains each oriented relative to one another and with a tilt and azimuthal misorientation of less than about 8°.

17. A surface acoustic wave device according to claims 15 wherein said first and second interdigitated electrodes are positioned between respective first and second piezoelectric layer portions and said diamond layer.

18. A surface acoustic wave device according to claim 15 wherein said first and second interdigitated electrodes are positioned on respective first and second piezoelectric layer portions opposite said diamond layer.

19. A surface acoustic wave device according to claim 15 further comprising a ground plane electrode on at least one of said diamond layer, and said first and second piezoelectric layer portions.

20. A surface acoustic wave device comprising:

a diamond layer;

first and second piezoelectric layer portions on said diamond layer in laterally spaced apart relation;

first and second interdigitated electrodes on respective first and second piezoelectric layer portions;

an insulating layer on said diamond layer between said first and second interdigitated electrodes;

a semiconducting layer on said insulating layer opposite said first and second piezoelectric layer portions; and a pair of amplification electrodes on said semiconducting layer so that said surface acoustic wave device defines a surface acoustic wave amplifier.

21. A surface acoustic wave device comprising:

a diamond layer;

first and second piezoelectric layer portions on said diamond layer in laterally spaced apart relation; and first and second interdigitated electrodes on respective first and second piezoelectric layer portion;

wherein each of said pair of interdigitated electrodes comprises a predetermined pattern of electrically conductive highly doped surface portions of said diamond layer adjacent respective piezoelectric layer portions.

22. A surface acoustic wave device according to claim 21 wherein said first and second interdigitated electrodes each comprise a plurality of electrically conductive lines having a width of not less than about 1 µm and a spacing between adjacent lines of not less than about 1 µm.

23. A surface acoustic wave device according to claim 21 further comprising a single crystal nondiamond substrate on said highly oriented diamond layer opposite said piezoelectric layer.

24. A surface acoustic wave device comprising:
   a diamond layer;
   first and second piezoelectric layer portions on said diamond layer in laterally spaced apart relation;
   first and second interdigitated electrodes on respective first and second piezoelectric layer portions; and
   an acoustic wave absorber adjacent an end of at least one of said piezoelectric layer portions.

25. A surface acoustic wave device comprising:
   a diamond layer;
   first and second piezoelectric layer portions on said diamond layer in laterally spaced apart relation;
   first and second interdigitated electrodes on respective first and second piezoelectric layer portions; and
   a thermistor formed in said diamond layer.

26. A surface acoustic wave device comprising:
   a diamond layer having a predetermined pattern of electrically conductive highly doped surface portions defining at least one interdigitated electrode, said predetermined pattern of highly doped surface portions of said diamond layer having a dopant concentration of greater than about $10^{19}$ atoms cm$^{-3}$; and
   a piezoelectric layer on said diamond layer and overlying said at least one interdigitated electrode.

27. A surface acoustic wave device according to claim 26 wherein said diamond layer comprises a highly oriented diamond layer having a plurality of side-by-side columnar diamond grains each oriented relative to one another and with a tilt and azimuthal misorientation of less than about 8°.

28. A surface acoustic wave device according to claim 27 further comprising a single crystal nondiamond substrate on said highly oriented diamond layer opposite said piezoelectric layer.

29. A surface acoustic wave device according to claim 26 wherein said at least one interdigitated electrode comprises a pair of interdigitated electrodes on said piezoelectric layer adjacent opposing ends thereof, wherein said pair of interdigitated electrodes define an axis of surface acoustic wave propagation therebetween, and wherein said piezoelectric layer has opposing ends canted at an angle from orthogonal to the axis of surface acoustic wave propagation to reduce undesirable wave reflections.

30. A surface acoustic wave device according to claim 26 wherein said at least one interdigitated electrode comprises first and second interdigitated electrodes positioned between said piezoelectric layer and said diamond layer in laterally spaced apart relation.

31. A surface acoustic wave device according to claim 26 further comprising electrically conductive lines on said predetermined pattern of electrically conductive highly doped diamond surface portions.

32. A surface acoustic wave device according to claim 26 further comprising a ground plane electrode on at least one of said diamond layer and said piezoelectric layer.

33. A surface acoustic wave device according to claim 26 further comprising at least one acoustic wave absorber adjacent an end of said piezoelectric layer.

34. A surface acoustic wave device comprising:
   a diamond layer;
   a piezoelectric layer on said diamond layer; and
   at least one interdigitated electrode on said piezoelectric layer, said at least one interdigitated electrode defining an axis of surface acoustic wave propagation, said piezoelectric layer having respective opposing ends canted at an angle from orthogonal to the axis of surface acoustic wave propagation to reduce undesirable wave reflections wherein said at least one interdigitated electrode comprises a predetermined pattern of electrically conductive highly doped surface portions of said diamond layer adjacent said piezoelectric layer.

35. A surface acoustic wave device according to claim 34 wherein said at least one interdigitated electrode comprises a pair of interdigitated electrodes aligned along the axis of surface acoustic wave propagation and positioned adjacent respective opposing canted ends of said piezoelectric layer.

36. A surface acoustic wave device according to claim 34 wherein said diamond layer also has respective opposing ends canted at an angle from orthogonal to the axis of surface acoustic wave propagation and corresponding to said piezoelectric layer to reduce undesirable wave reflections.

37. A surface acoustic wave device according to claim 34 wherein both said diamond and piezoelectric layers have respective opposing sides parallel to the axis of acoustic wave propagation.

38. A surface acoustic wave device according to claim 34 wherein said diamond layer comprises a highly oriented diamond layer comprising a plurality of side-by-side columnar diamond grains each oriented relative to one another and with a tilt and azimuthal misorientation of less than about 8°.

39. A surface acoustic wave device according to claim 34 wherein said at least one interdigitated electrode is positioned between said highly oriented diamond layer and said piezoelectric layer.

40. A surface acoustic wave device according to claim 34 wherein said at least one interdigitated electrode is positioned on said piezoelectric layer opposite said highly oriented diamond layer.

41. A surface acoustic wave device according to claim 34 wherein said at least one interdigitated electrode comprises a plurality of electrically conductive lines having a width of not less than about 1 µm and a spacing between adjacent lines of not less than about 1 µm.

42. A surface acoustic wave device comprising:
   a diamond layer having a predetermined doped surface portion defining an electrical resistor for absorbing an acoustic wave;
   a piezoelectric layer on said diamond layer and overlying said predetermined doped surface portion so that said doped surface of said diamond layer defining a resistor electrically terminates said piezoelectric layer thereby reducing surface acoustic wave reflections; and
   at least one interdigitated electrode on said piezoelectric layer.

43. A surface acoustic wave device according to claim 42 wherein said at least one interdigitated electrode comprises a predetermined pattern of electrically conductive highly doped surface portions of said diamond layer.

44. A surface acoustic wave device according to claim 42 wherein said piezoelectric layer comprises first and second piezoelectric layer portions on said diamond layer in laterally spaced apart relation, and wherein said at least one interdigitated electrode comprises a first interdigitated electrode on said first piezoelectric layer portion and a second interdigitated electrode on said second piezoelectric layer portion such that a surface acoustic wave propagates between said first and second piezoelectric layer portions only through said diamond layer at a velocity of surface acoustic wave propagation determined only by said diamond layer.

45. A surface acoustic wave device according to claim 42 wherein said diamond layer comprises a highly oriented diamond layer comprising a plurality of side-by-side columnar diamond grains each oriented relative to one another and with a tilt and azimuthal misorientation of less than about 8°.

* * * * *